United States Patent [19]

Vig et al.

[11] 4,344,010
[45] Aug. 10, 1982

[54] ACCELERATION RESISTANT COMBINATION OF OPPOSITE-HANDED PIEZOELECTRIC CRYSTALS

[75] Inventors: John R. Vig, Colts Neck; Arthur D. Ballato, Long Branch, both of N.J.

[73] Assignee: The United States of America as represented by the Secretary of the Army, Washington, D.C.

[21] Appl. No.: 86,504

[22] Filed: Oct. 19, 1979

[51] Int. Cl.³ .......................................... H01L 41/08
[52] U.S. Cl. ................................. 310/361; 310/360; 310/329; 310/315; 310/346; 331/175
[58] Field of Search ............... 310/331, 332, 342, 315, 310/339, 348, 360, 346, 361; 331/158, 162, 166, 175, 56, 116 R; 58/23 TF, 23 V

[56] References Cited

U.S. PATENT DOCUMENTS

| | | | |
|---|---|---|---|
| 2,410,825 | 11/1946 | Lane | 310/361 |
| 3,084,228 | 4/1963 | Shiga | 310/332 X |
| 3,502,913 | 3/1970 | Osada | 310/339 |
| 3,600,951 | 8/1971 | Easton | 331/158 |
| 4,219,754 | 8/1980 | Hoshi et al. | 310/342 X |

Primary Examiner—Mark O. Budd
Attorney, Agent, or Firm—Nathan Edelberg; Jeremiah G. Murray; Edward Goldberg

[57] ABSTRACT

An acceleration resistant crystal features two crystals mounted together with at least two axes of each crystal being in antiparallel relationship with respect to corresponding axes of the other crystals. The two crystals can be chiral pairs and thus have three corresponding axes in antiparallel relationship for acceleration resistance in any arbitrary direction with respect to the crystal axes.

19 Claims, 8 Drawing Figures

U.S. Patent    Aug. 10, 1982    4,344,010
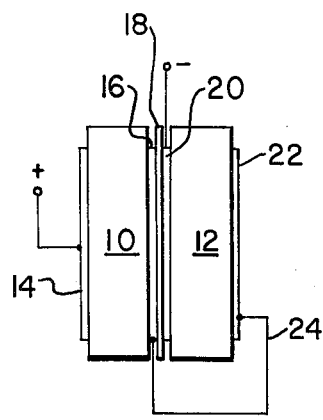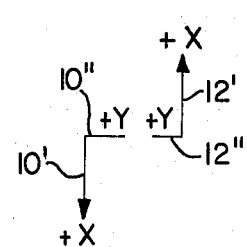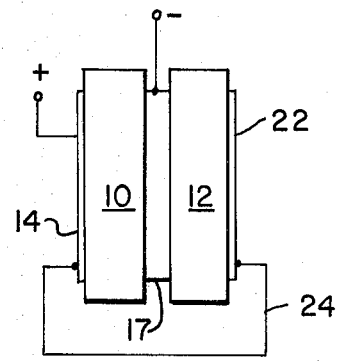
FIG.1    FIG.2
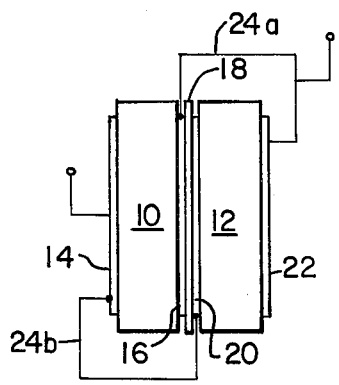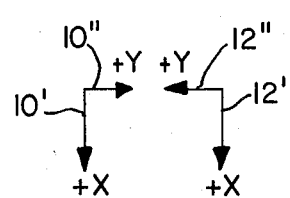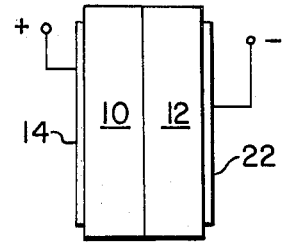
FIG.3    FIG.4
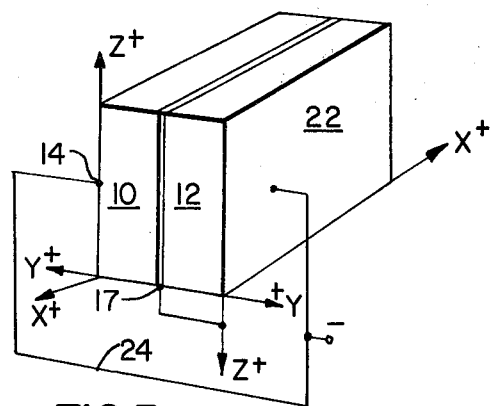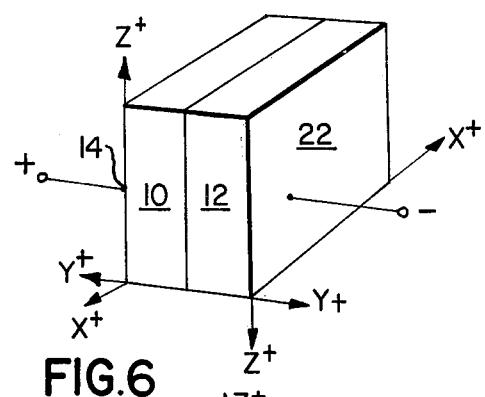
FIG.5    FIG.6
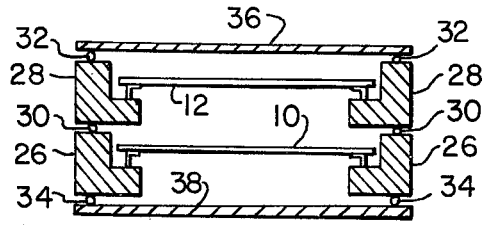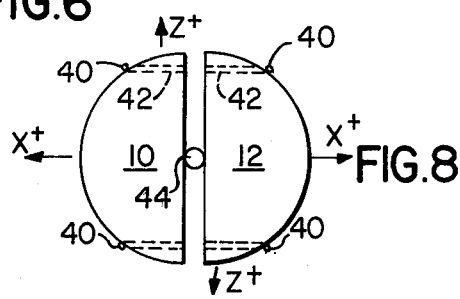
FIG.7    FIG.8

ACCELERATION RESISTANT COMBINATION OF OPPOSITE-HANDED PIEZOELECTRIC CRYSTALS

BACKGROUND OF THE INVENTION

The present invention relates to crystal combinations that are resistant to acceleration, and more particularly to those that resist change in their resonant frequency.

As is commonly known, quartz crystals are used to control the frequency of electrical oscillators and in other circuits where an electrical resonant frequency is used. However, a problem with such crystals is that their natural resonant frequency changes with acceleration that may be applied to the crystal. One approach to the problem is shown by D. L. Hammond in the paper entitled "Precision Quartz Resonators" in the *Proceedings of the Fifteenth Annual Symposium on Frequency Control,* pages 125–138 (1961). This approach used a special mounting for the crystal to reduce the effect of acceleration. In particular, the paper describes two support rings which have six stretched wires to support the crystal. However, the wires are prone to breakage.

Another approach is shown by J. J. Gagnepain and F. L. Walls, "Quartz Crystal Oscillators with Low Acceleration Sensitivity", NBSIR 77-855, National Bureau of Standards (1977). This publication shows two crystals electrically connected in series with one of their axes being anti-parallel oriented. The result of this configuration is that acceleration forces are reduced in the one direction of the anti-parallel oriented axis by about the same amount as in the Hammond configuration.

SUMMARY OF THE INVENTION

It is therefore an object of the present invention to provide an acceleration resistant crystal configuration which is acceleration resistant along all directions.

It is another object of the present invention to provide an acceleration resistant crystal configuration which is rugged and is highly resistant to breakage.

In brief, these and other objects of the invention are achieved by having two crystals which are electrically coupled or mechanically coupled, or both electrically and mechanically coupled together. At least two axes of one crystal are disposed in anti-parallel relationship with the corresponding axes of the other crystal. Further, two crystals, one left-handed and one right-handed, can be either electrically coupled or mechanically coupled, or both electrically and mechanically coupled together. When all three axes of one crystal are disposed in an antiparallel relationship to that of the other crystal, a reduction in acceleration sensitivity in all three directions results. If desired, the two crystals in this configuration, can be mechanically joined together, resulting in a shock and vibration resistant unit.

DESCRIPTION OF THE DRAWINGS

FIG. 1 shows a series connection of two crystals with an insulator between them, two axes being antiparallel; said crystals and insulator being mechanically joined firmly together;

FIG. 2 shows a parallel connection of two crystals with a connecting wire; said crystals being mechanically joined firmly together;

FIG. 3 shows a parallel connection of two crystals with an insulator and connecting wire between the crystals; said crystals and insulator being joined firmly mechanically together;

FIG. 4 shows a series connection of two crystals without an intermediate layer or connecting wire; said crystals being firmly joined mechanically together;

FIG. 5 shows a parallel connection with three axes in antiparallel relationship;

FIG. 6 shows a series connection with three axes in antiparallel relationship;

FIG. 7 shows one method of mounting two crystal blanks in a discrete (non-mechanically joined) fashion; and FIG. 8 shows another method of mounting crystal blanks in a discrete (non-mechanically joined) fashion.

DETAILED DESCRIPTION OF THE INVENTION

FIG. 1 shows two crystals 10 and 12. These crystals normally have the same resonant frequency, but it may be desirable to have slightly different resonant frequencies. They can be AT cuts. A similar arrangement has been used for filtering purposes: A. Ballato and T. Lukaszek, "Stacked-Crystal Filters," *Proc. IEEE,* Vol. 61, pages 1495–1496 (1973). In between FIGS. 1 through 2, arrows 10' and 12' indicate the plus X crystallographic axes direction of crystals 10 and 12 respectively. It will be noted that the axes of these crystals are antiparallel to each other. Also shown are arrows 10" and 12" which show the plus Y crystallographic axes of crystals 10 and 12 respectively. It will be noted that they are also antiparallel with respect to each other. The plus Z crystallographic axes directions for crystals 10 and 12 both come out of the plane of the drawing respectively, and thus are in parallel arrangement. This crystal orientation also holds true for FIG. 2.

Returning now to FIG. 1, it shows an electrode 14 coupled to a source of instantaneous plus potential, an electrode 16 on the right side of crystal 10, an insulating material 18, and an electrode 20 coupled to a minus source of potential and to the left-hand side of crystal 12. Electrode 22 is disposed on the right-hand side of crystal 12 and is coupled through a wire 24 to electrode 16. It will thus be seen that the two crystals 10 and 12 are electrically coupled in series with respect to each other.

One problem in the embodiment of FIG. 1 is that the insulator 18 causes an undesired capacitance between electrodes 16 and 20. Another problem is that the insulating material 18 might not occur at a vibrational node of the crystals 10 and 12, and thus have a dampening effect on the vibrations. This would lower the overall effective Q of the compound crystal combination. Further, lead 24 is subject to breakage from vibration.

FIG. 2 shows another embodiment of the invention where corresponding components have been given corresponding reference numerals and the crystallographic axes are the same as shown in FIG. 1. It will be seen that electrode 17 is coupled to the source of negative potential, and it is disposed between crystals 10 and 12. This eliminates the problem associated with the insulator 18, but still there is the problem of breakage of the lead 24. It will be seen in this embodiment that the crystals 10 and 12 are electrically coupled in parallel with respect to each other and the potential source.

FIG. 3 shows another embodiment of the invention, where corresponding parts have been given corresponding reference numerals. The arrows in between FIGS. 3 and 4 show the orientation of the crystallographic axes for the X and Y axes for these figures. It will be noted that the X axes are in parallel orientation and the Y axes are antiparallel. One plus Z axis goes into the plane of the drawing, while the other plus Z axis comes out of it. Thus, they are antiparallel to each other. It will be further noted that in FIGS. 1-4, the Y axes are all antiparallel. This is desirable since the resonant frequency change with acceleration is greatest along this axis, and therefore it should always be compensated. The embodiment of FIG. 3 has crystals 10 and 12 coupled in parallel with respect to each other. It has the problems described above with respect to insulator 18, and further has two connecting leads 24A, 24B, with the attendant problems of breakage as described above.

FIG. 4 shows a preferred embodiment of the invention, where again corresponding components have been given corresponding reference numerals. The two crystals 10 and 12 can be joined together through the use of a metallizing layer 17 as shown in FIG. 2; however using modern techniques, it is possible to join one crystal upon the other, thus eliminating the use of a metallizing layer 17. It will be seen that this embodiment has no problems with an insulating layer to lower the effective Q of the overall compound crystal, nor does it have any problem with breakage of any interconnecting leads.

In all of the embodiments described so far, it is only possible to compensate on two of the three axes. Three axes compensation can be done with quartz occurring in "enantiomorphous pairs" otherwise known as "chiral" forms. Such forms of crystal have been described extensively in W. G. Cady and K. S. Van Dyke, "Proposed Standard Conventions for Expressing the Elastic and Piezoelectric Properties of Right and Left Quartz", *Proceedings of the IRE*, Volume 30, 1941, pages 495 to 499. Basically these forms of quartz twist polarized light into different forms of circular polarized light, and therefore are known as either right-handed (RH) or left-handed (LH) quartz in accordance with the direction that they twist the light. By using a right- and a left-handed crystal together, it is possible to produce a truly vibration and acceleration resistant total crystal in all three dimensions. The two crystal elements can be mechanically and electrically coupled together as described above, or just electrically coupled together as described in Gagnepain and Walls supra for two right-handed crystals. The chiral pairs used to make the device can be cut along any orientation desired, so long as both members of the pair are identical mirror images, and this orientation can even be the most general doubly rotated orientation, e.g., the SC cut. This means that a RH-SC cut can be paired with a LH-SC cut just as easily as right-handed and left-handed AT cuts can be paired. A discussion of the SC cut can be found in A. Ballato "Doubly Rotated Thickness Mode Plate Vibrators" in "Physical Acoustics: Principles and Methods" (W. P. Mason and R. N. Thurston, eds.), Volume 13, chapter 5, Academic Press, New York, 1977, pages 115 to 181. If just electrical interconnection is used, then the main consideration is that all three corresponding axes must be antiparallel with respect to each other. Either series or parallel operation is possible. If the crystals are to be mechanically stacked also, then for doubly rotated cuts in general, the motion of the desired mode is neither strictly in the plane of the crystal nor strictly out of it. The question then arises whether the motion of the two crystals would interfere with each other. However, it can be shown that two crystals can be joined together without interference, thus a working unit is the result.

A convenient method of fabricating enantiomorphous pairs of doubly-rotated resonators is as follows. Fabricate the plates according to art established techniques, except instead of marking all plates with a +X flat, mark the left-handed plates on +X and the right-handed plates on −X with a different mark. The two kinds of X-marks can be, for example, a flat and a notch, or two different kinds of notches. After the plates are final lapped with a 5 μm or finer abrasive, they are chemically polished. For example, if the plates are SC-cut, a suitable chemical polish is a 12 percent aqueous solution of hydrogen fluoride at 75° C. After the plates are etched to about $\Delta f = 10\ f_o f_f$ where $f_o$ and $f_f$ are the initial and final frequencies, respectively, in megahertz, and $\Delta f$ is the difference between $f_o$ and $f_f$ in kilohertz, the plates will be polished on both sides. However, one side of each plate will have a higher polish than the other. That is, one can observe with the unaided eye that one side of each plate is shinier than the other. This phenomenon can facilitate the antiparallel alignment of the plate normals. One can thus orient the axes of enantiomorphous pairs properly by selecting one each of the plates with the two different kinds of X-marks, and superposing the X-marks in such a manner that the shinier (or rougher) sides face each other. This procedure will assure that all three axes are antiparallel.

FIG. 5 shows the first embodiment of the invention using chiral pairs 10 and 12. Where, for example, 10 is a left-handed crystal and 12 is a right-handed one. They are connected in parallel which requires the interconnecting lead 24 and a common center electrode 17. It will be noted that all three axes of crystal 10 are arranged in anti-parallel relationship with respect to the corresponding axes of crystal 12. Thus, all three axes are acceleration and shock compensated.

FIG. 6 shows another embodiment where again crystal 10 has its three axes in anti-parallel relationship with corresponding axes of crystal 12. Crystal 10 can be a left-handed crystal and crystal 12 can be a right-handed one. It will be noted that no central electrode is needed since one of the crystals is epitaxially joined upon another. The result is that the two crystals 10 and 12 are electrically coupled in series with respect to each other.

It is noted that the axial directions shown in FIGS. 1 to 6 are not necessarily the crystallographic axes. This is because of the rotation that the quartz undergoes before cutting.

As stated above, it is not necessary that the two crystals be mechanically touching as is shown in the embodiment of FIG. 7. The left-hand crystal 10 is mounted in a frame 26, while the right-hand crystal is mounted on a frame 28. The two frames are joined to each other using a gold gasket 30. Further gold gaskets 32 and 34 seal the unit when lids 36 and 38 are respectively placed adjacent to gaskets 32 and 34. The entire unit is called a "flat-pack type" of enclosure. The required electrical connections (not shown) can be made after the unit is sealed. Alternatively, by proper metallization of frames 26 and 28, gasket 30 can serve to interconnect properly the two resonators. An alternative arrangement to the embodiment shown in FIG. 7 is to invert frame 26 as to further separate crystals 10 and 12.

Another type of mount is shown in FIG. 8 where the crystals 10 and 12 are semi-circular blanks and possibly have a flat section shown by dotted line 42 to determine orientation. They are mounted in clips 40 so as to permit both sides of each crystal to be accessible for cleaning and plating, subsequent to the mounting and bonding steps of the fabrication sequence. A further clip 44 provides support and the electrical contact between the crystals 10 and 12.

In both FIGS. 7 and 8, it is of course required that all three axes of one crystal be antiparallel with respect to the corresponding axes of the other crystal. It is also possible to use a common set of mounting clips to mount the two crystals.

In those embodiments which actually have a mechanical touching of the two crystals together, this can be done by preparing an optically flat surface on each of the two crystal resonators, cleaning the surfaces carefully for example by short wavelength ultraviolet light and ozone, then metallizing the surfaces, and finally positioning the surfaces together in a clean environment. Such an environment can be an ultrahigh vacuum system. This could eliminate the metallizing step and one crystal could be epitaxially joined to another. The blanks could be plano-plano or plano-convex. The planoconvex blanks after assembly would appear to be biconvex and would probably have better acceleration resistance than the plano-plano blanks.

It will be appreciated that the concept of the invention does not apply only to crystal resonators, but also to such devices as delay lines, filters, correlators, convolvers; and also to such devices using other types of waves and modes as surface acoustic waves (SAW), surface-skimming bulk or shallow bulk waves, Stonely waves, contour modes, flexure modes, torsion modes, rod modes, SAW waves of the Raleigh type and of the Love type, electroelastic waves of the Bleustein type, and so on. Further, the crystal cuts used preferably are along the zero temperature coefficient locus.

It will be appreciated that many other embodiments are possible without departing from the spirit and scope of the invention.

What is claimed is:

1. A composite crystal structure comprising a left and right handed pair of crystals positioned adjacent one another and electrically coupled to each other, one of said crystals having three axes disposed in anti-parallel relationship with respect to the corresponding axes of the other crystal whereby the effect of acceleration in all directions on the resonant frequency of the composite structure is minimized.

2. A composite crystal structure as claimed in claim 1, wherein said crystals are both mechanically and electrically coupled to each other.

3. A composite crystal structure as claimed in claim 2, wherein each of said crystals have metal electrodes disposed on either side thereof, and further comprising an insulator disposed between said crystals.

4. A composite crystal structure as claimed in claim 3, further comprising lead means for coupling said crystals together.

5. A composite crystal structure as claimed in claim 4, wherein said lead means electrically couples said crystals in series.

6. A composite crystal structure as claimed in claim 4, wherein said lead means electrically couples said crystals in parallel.

7. A composite crystal structure as claimed in claim 1, wherein each of said crystals have a single metallizing electrode, and further comprising an intermediate conducting electrode coupled to both of said crystals, and a lead means for electrically connecting said crystals in parallel.

8. A composite crystal structure as claimed in claim 1, wherein said crystals are mechanically coupled without any intermediate structure therebetween.

9. A composite crystal structure comprising an enantiomorphous pair of closely positioned crystals, one of said crystals having three axes arranged in anti-parallel relationship with respect to the corresponding axes of the other of said pair of crystals, said crystals being electrically coupled together and being acceleration resistant in all directions.

10. A composite crystal structure as claimed in claim 9, wherein said crystals are mechanically joined without the use of any intermediate structure.

11. A composite crystal structure as claimed in claim 9, further comprising a common center electrode means for joining said crystals together, and a lead means for electrically coupling said crystals in parallel.

12. A composite crystal structure as claimed in claim 9, wherein said crystals are mounted within flat-pack type mounts.

13. A composite crystal structure as claimed in claim 1, including means on a surface of each crystal for identifying the opposite handedness of one with respect to the other to facilitate the antiparallel alignment of said crystal axes.

14. A composite crystal structure as claimed in claims 1 or 9, wherein said crystal pairs are AT cuts.

15. A composite crystal structure as claimed in claims 1 or 9, wherein said crystal pairs are SC cuts.

16. A composite crystal structure as claimed in claims 1 or 9, wherein said crystal pairs are cuts on the zero temperature coefficient of frequency locus.

17. A composite crystal structure as claimed in claims 1 or 9, wherein said crystals have slightly differing resonant frequencies.

18. A composite crystal structure as claimed in claims 1 or 9, wherein said crystal pairs are chemically polished doubly-rotated cuts.

19. A composite crystal structure as claimed in claims 1 or 9, wherein said crystal pairs are chemically polished SC-cuts.

* * * * *